United States Patent
Oppelt et al.

(10) Patent No.: US 9,778,330 B2
(45) Date of Patent: Oct. 3, 2017

(54) METHOD FOR SIMULTANEOUS TRANSMISSION OF HIGH-FREQUENCY TRANSMISSION SIGNALS VIA A COMMON HIGH-FREQUENCY LINE

(71) Applicants: Ralph Oppelt, Uttenreuth (DE); Jian Min Wang, ShenZhen (CN)

(72) Inventors: Ralph Oppelt, Uttenreuth (DE); Jian Min Wang, ShenZhen (CN)

(73) Assignee: Siemens Aktiengesellschaft, München (DE)

( * ) Notice: Subject to any disclaimer, the term of this patent is extended or adjusted under 35 U.S.C. 154(b) by 1051 days.

(21) Appl. No.: 13/931,611

(22) Filed: Jun. 28, 2013

(65) Prior Publication Data

US 2014/0002087 A1    Jan. 2, 2014

(30) Foreign Application Priority Data

Jun. 29, 2012   (DE) .................. 10 2012 211 312

(51) Int. Cl.
*G01R 33/28* (2006.01)
*H04B 3/02* (2006.01)
(Continued)

(52) U.S. Cl.
CPC .......... *G01R 33/28* (2013.01); *G01R 33/3621* (2013.01); *H04B 3/02* (2013.01); *H04B 3/50* (2013.01); *G01R 33/3415* (2013.01)

(58) Field of Classification Search
CPC  G01R 33/28; G01R 33/3415; G01R 33/3621; H04B 3/02; H04B 3/50
See application file for complete search history.

(56) References Cited

U.S. PATENT DOCUMENTS

| | | | | |
|---|---|---|---|---|
| 5,384,536 A | * | 1/1995 | Murakami | G01R 33/28 324/309 |
| 5,387,867 A | * | 2/1995 | Bourg | G01R 33/60 324/316 |

(Continued)

FOREIGN PATENT DOCUMENTS

| | | |
|---|---|---|
| CN | 201830256 U | 5/2011 |
| CN | 102201825 A | 9/2011 |

(Continued)

OTHER PUBLICATIONS

German Office Action dated Feb. 8, 2013 for corresponding German Patent Application No. DE 10 2012 211 312.6 with English translation.

(Continued)

*Primary Examiner* — Dixomara Vargas
(74) *Attorney, Agent, or Firm* — Lempia Summerfield Katz LLC

(57) ABSTRACT

A method for simultaneous transmission of at least two high-frequency transmission signals via a common high-frequency line includes providing at least two input signals at respective inlet ports. The input signals are signals of a same carrier frequency. From the input signals, respective transmission signals are provided with different transmission frequencies from each other and from the carrier frequency by mixing the input signals using one frequency mixer each. The frequency mixers are supplied with respective mixer oscillator signals. The transmission signals are transmitted via the common high-frequency line. The mixer oscillator signals are provided from a same oscillator signal.

20 Claims, 3 Drawing Sheets

(51) Int. Cl.
  *G01R 33/36* (2006.01)
  *H04B 3/50* (2006.01)
  *G01R 33/3415* (2006.01)

(56) References Cited

U.S. PATENT DOCUMENTS

| | | | | |
|---|---|---|---|---|
| 5,502,386 | A * | 3/1996 | Bourg | G01R 33/60 |
| | | | | 324/316 |
| 7,345,481 | B2 * | 3/2008 | Leussler | G01R 33/34046 |
| | | | | 324/318 |
| 7,508,212 | B2 * | 3/2009 | Fain | G01R 33/345 |
| | | | | 324/318 |
| 7,701,220 | B2 * | 4/2010 | Ehnholm | G01R 33/3415 |
| | | | | 324/318 |
| 7,714,581 | B2 * | 5/2010 | Erickson | G01R 33/345 |
| | | | | 324/318 |
| 7,805,176 | B2 * | 9/2010 | Ruppert | A61B 5/0515 |
| | | | | 600/407 |
| 8,089,280 | B2 * | 1/2012 | Soutome | G01R 33/34076 |
| | | | | 324/318 |
| 8,324,897 | B2 * | 12/2012 | Hornung | G01R 33/3621 |
| | | | | 324/308 |
| 8,374,279 | B2 | 2/2013 | Adler et al. | |
| 8,686,723 | B2 * | 4/2014 | Anand | G01R 33/4625 |
| | | | | 324/303 |
| 9,134,390 | B2 * | 9/2015 | Evers | G01R 33/422 |
| 2008/0166988 | A1 | 7/2008 | Javor et al. | |
| 2009/0286478 | A1 | 11/2009 | Biber et al. | |
| 2011/0260806 | A1 | 10/2011 | Takeuchi | |
| 2012/0142283 | A1 | 6/2012 | Taya | |

FOREIGN PATENT DOCUMENTS

| | | |
|---|---|---|
| CN | 102204100 A | 9/2011 |
| CN | 202050038 U | 11/2011 |
| CN | 102487285 A | 6/2012 |
| DE | 10 2006 008 790 A1 | 9/2007 |
| EP | 0 554 584 A1 | 8/1993 |
| JP | H1146153 A | 2/1999 |

OTHER PUBLICATIONS

Chinese Search Report for Chinese Patent Application No. 2013102581550, dated Jul. 21, 2015 with English Translation.

* cited by examiner

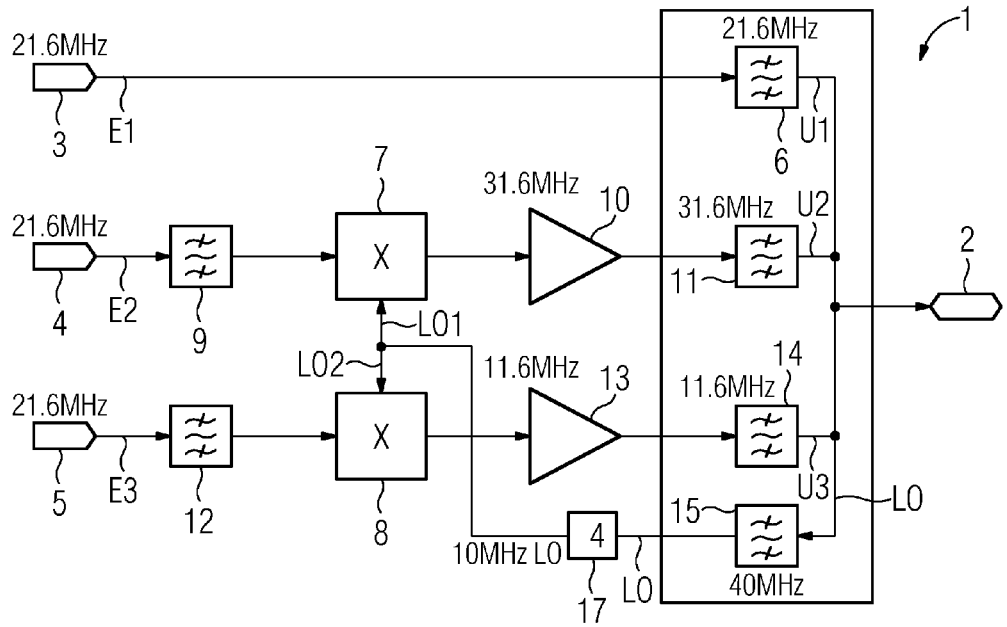
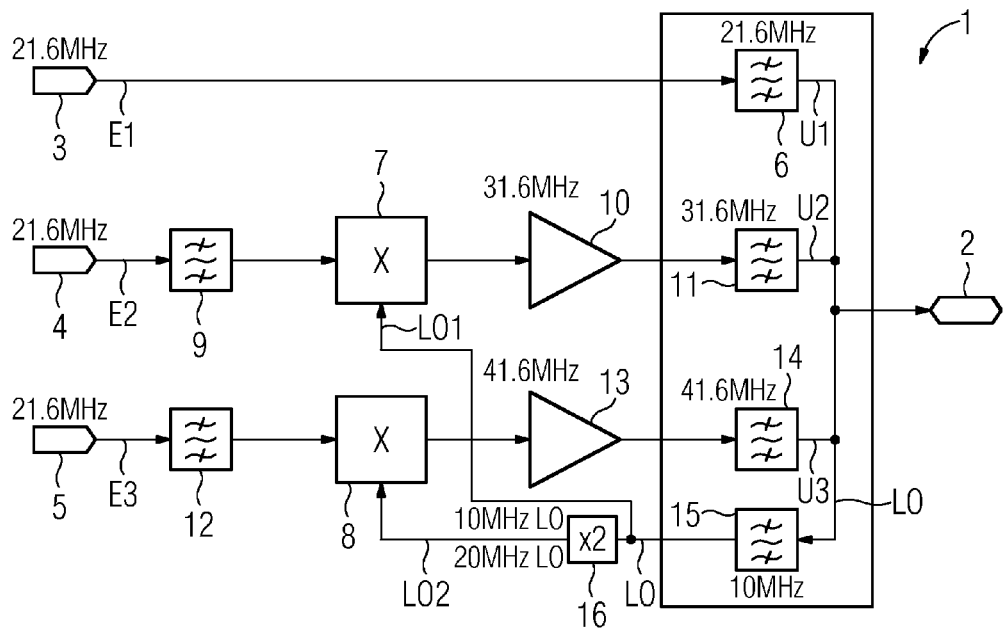

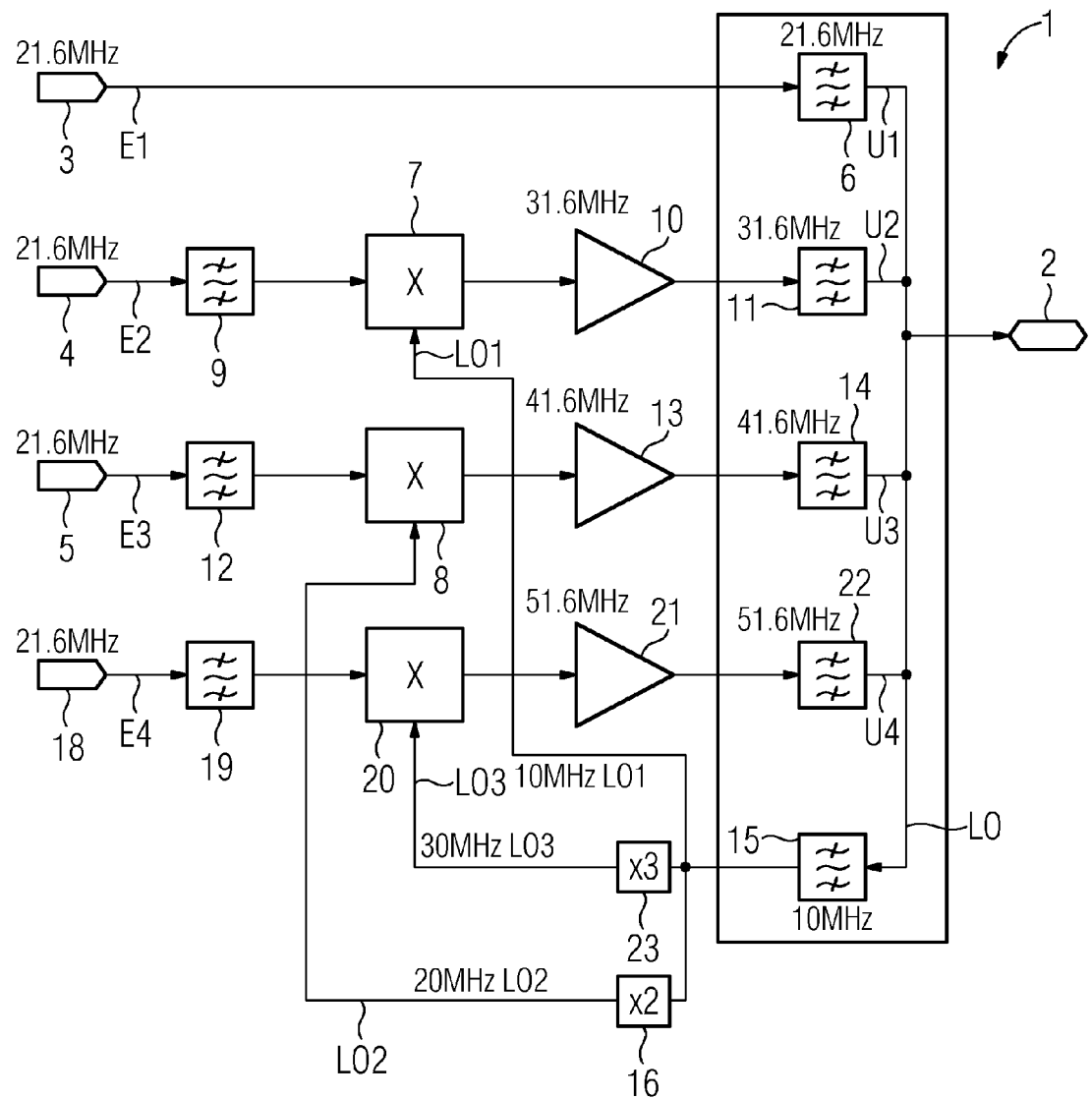

METHOD FOR SIMULTANEOUS TRANSMISSION OF HIGH-FREQUENCY TRANSMISSION SIGNALS VIA A COMMON HIGH-FREQUENCY LINE

This application claims the benefit of DE 10 2012 211 312.6, filed on Jun. 29, 2012, which is hereby incorporated by reference.

BACKGROUND

The present embodiments relate to simultaneous transmission of at least two high-frequency transmission signals via a common high-frequency line.

In magnetic resonance devices, magnetic resonance signals may be received with the aid of local coils. Images may be generated during a magnetic resonance scan. For good imaging, the received magnetic resonance signals are to have a relatively high signal-to-noise ratio. In magnetic resonance tomography, the magnetic resonance signals provided or received are transmitted with a cable connection to an electronic computing device or evaluation device. The electronic computing device or the evaluation device then processes the received magnetic resonance signals further. Because many local coils may be present, and each local coil provides one magnetic resonance signal (e.g., input signal) respectively, a relatively large amount of cabling work is to be performed. Efforts are therefore made to transmit several magnetic resonance signals via a common high-frequency line. Thus, in US 2009/286478 A1, the transmission of two magnetic resonance signals per cable is proposed. In this method, implementation takes place with the aid of a corresponding signal transmission device that is arranged in the vicinity of the local coils. With this signal transmission, various oscillator signals are provided for the frequency mixer. An individual LO frequency is thus provided per channel. This uses correspondingly complex frequency crossovers for the separation of different LO frequencies (e.g., local oscillator frequency).

SUMMARY AND DESCRIPTION

The scope of the present invention is defined solely by the appended claims and is not affected to any degree by the statements within this summary.

The present embodiments may obviate one or more of the drawbacks or limitations in the related art. For example, an improved method and an improved signal transmission device with which at least two high-frequency transmission signals may be transmitted via a common high-frequency line with minimum effort are provided.

A method is for simultaneous transmission of at least two high-frequency transmission signals via a common high-frequency line. At least two input signals (e.g., receive signals of a magnetic resonance tomography system) are provided at respective inlet ports, where the input signals have an equal or roughly equal carrier frequency that is, for example, around the Larmor frequency. From the input signals, respective transmission signals are provided with transmission frequencies different from each other and from the carrier frequency. This is achieved by mixing the input signals using one frequency mixer each. The frequency mixers are supplied with respective mixer oscillator signals. The transmission signals generated from the mixer oscillator signals are transmitted via the common high-frequency line. The mixer oscillator signals are supplied by the same oscillator signal.

In one or more of the present embodiments, a mixer oscillator signal may be a signal that is obtained from the common oscillator signal and supplied directly to the respective mixer or fed into the mixer.

To supply the frequency mixers, therefore, only one single, common oscillator signal that may be divided between the at least two frequency mixers or from which the mixer oscillator signals for the at least two frequency mixers are provided is provided. Only a single oscillator signal (e.g., a single LO frequency) is to be transmitted from the electronic processing device, where the common oscillator signal may be transmitted via the common high-frequency line to the frequency mixers. The method according to one or more of the present embodiments therefore results in a clear reduction in work overall with regard to the supply of the frequency mixers, because the existing oscillator signal may be used at least twice. The use of a filter to separate different LO frequencies or different oscillator signals with the associated disadvantages with regard to cost and valuable installation space is rendered unnecessary. In addition, unwanted mixed products and noise couplings that may arise from incomplete separation of different oscillator signals are avoided as a result. This may be advantageous in the case of a magnetic resonance tomography system in which a relatively high signal-to-noise ratio is required.

In one embodiment, at least three transmission signals are transmitted via the common high-frequency line. For example, at least three input signals of the same or approximately the same carrier frequency may be provided, and one of the input signals may be directly transmitted unmixed as a transmission signal with the carrier frequency via the common high-frequency line. Therefore, if three input signals are provided, then two of the input signals may be mixed with the aid of respective frequency mixers and thus converted into respective transmission signals with different frequencies, while a third input signal may be transmitted directly and therefore unmixed with the carrier frequency via the common high-frequency line. Consequently, the number of transmitted signals may be further increased, furthermore minimizing the cabling. In addition, the input signal also obviates the need to use an additional frequency mixer with the associated mixer oscillator signal, saving both expense and valuable installation space.

In one embodiment, the oscillator signal for the provision of the respective mixer oscillator signals is transmitted via the common high-frequency line to the frequency mixers. This provides that the transmission signals are transmitted via the common high-frequency line while in the opposite direction, the oscillator signal is transmitted. An additional high-frequency line for transmission of the oscillator signal may thus be saved.

In one embodiment, at least two mixer oscillator signals provided from the same oscillator signal have the same frequency. At least two frequency mixers that provide corresponding transmission signals may therefore be supplied with mixer oscillator signals of the same frequency. In this embodiment, one of the frequency mixers is an up converter, and the other frequency mixer is a down converter. One of the input signals is thus mixed upward while the other input signal is mixed downward. Two transmission signals with completely different transmission frequencies are thus obtained, enabling the transmission signals to be transmitted via the common high-frequency line without the transmission signals influencing each other. In addition, this embodiment has the advantage that the same mixer oscillator signals are provided, and consequently, the common oscillator signal does not have to be converted with the aid of a frequency divider or a frequency multiplier. Two oscillator signals do not have be separated from each other again with the aid of an LO channel filter.

In one embodiment, different mixer oscillator signals are generated from the common oscillator signal in order to enable mixing in different frequency positions. Thus, for example, at least one mixer oscillator signal may be generated from the common oscillator signal using a frequency divider. In addition or alternatively, at least one mixer oscillator signal may also be generated from the common oscillator signal using a frequency multiplier (e.g., a frequency doubler). If, for example, there is a common oscillator signal with a frequency of, for example, 10 MHz, then a mixer oscillator signal with a frequency of, for example, 20 MHz and/or a mixer oscillator signal with a frequency of, for example, 5 MHz may be obtained "on board" from this oscillator signal. Thus, even with only one single oscillator signal, more than three transmission signals may be provided per frequency multiplex, which are then all transmitted via the common high-frequency line. Only a single oscillator signal is provided for this purpose. The single oscillator signal may also be supplied via the common high-frequency line.

A frequency multiplier and/or a frequency divider is also considered advantageous if, for example, on account of corresponding specifications, the LO frequency of the oscillator signal is relatively close to one of the frequency bands to be transmitted or relatively close to the transmission frequency of one of the transmission signals. With such a frequency multiplier or frequency divider, a mixer oscillator signal may be supplied from the oscillator signal, by which another transmission frequency of the transmission signal is generated.

In one embodiment, the oscillator signal is used directly as a mixer oscillator signal for at least one frequency mixer. With the frequency mixer, there is therefore no need for a frequency multiplier and a frequency divider.

In one embodiment, the at least two input signals are provided as receive signals of a magnetic resonance tomography system. The advantages of the method according to one or more of the present embodiments thus produce the best results because the cabling work for the magnetic resonance tomography system is significantly reduced compared with known magnetic resonance devices.

A method for simultaneous transmission of at least two high-frequency transmission signals via a common high-frequency line—is also provided. The method includes providing at least two input signals to respective inlet ports. The input signals are signals of the same carrier frequency. A transmission signal is provided, from at least one of the input signals, with a different transmission frequency from the carrier frequency by mixing the input signal using a frequency mixer. The transmission signal is transmitted via the common high-frequency line. One of the input signals is transmitted as a transmission signal unmixed with the carrier frequency via the common high-frequency line.

In addition, a signal transmission device that is configured to perform a method according to one or more of the present embodiments is also provided.

A magnetic resonance tomography system according to one or more of the present embodiments includes a signal transmission device.

The embodiments and the advantages of the embodiments presented with regard to the method apply correspondingly to the signal transmission device and to the magnetic resonance tomography system.

Additional features emerge from the claims, the figures and the description of the figures. All the aforementioned features and combinations of features in the description as well as the features and combinations of features mentioned in the description of the figures hereinafter and/or shown in the figures alone may be used not only in the respective combination specified, but also in other combinations or in isolation.

BRIEF DESCRIPTION OF THE DRAWINGS

The description below represents embodiments, and the invention is not restricted to these exemplary embodiments. The features of different exemplary embodiments according to FIGS. 1 to 5 may be combined with each other.

FIG. 3 shows yet another embodiment of a signal transmission device;

FIG. 4 shows one embodiment of a signal transmission device; and

FIG. 5 shows another embodiment of a signal transmission device.

DETAILED DESCRIPTION

Figure 1:
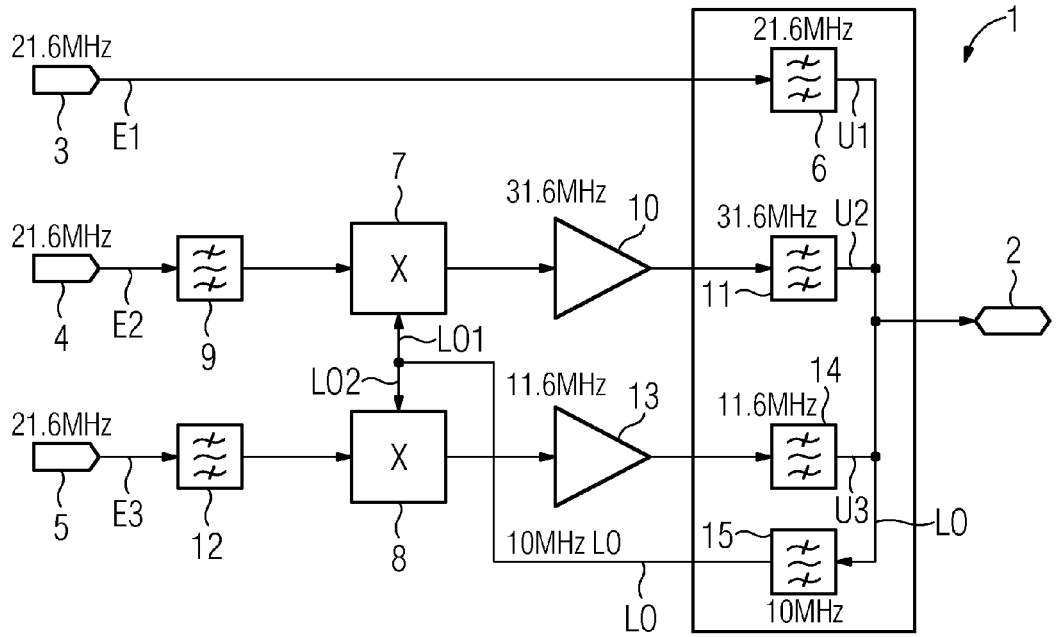
FIG. 1 shows one embodiment of a signal transmission device.

An embodiment of a signal transmission device 1 shown in FIG. 1 is for the transmission of, for example, three transmission signals U1, U2, U3 in total via a common high-frequency line 2 that, for example, may be configured as a coaxial line. FIG. 1 shows a block diagram of the signal transmission device 1.

The signal transmission device 1 may, for example, form part of a magnetic resonance tomography system. In the exemplary embodiment shown in FIG. 1, the signal transmission device 1 includes a total of three ports 3, 4, 5 that are, for example, each coupled to a local coil of the magnetic resonance tomography system. Input signals E1, E2, E3 that may be receive signals of the local coils of the magnetic resonance tomography system are provided at the ports 3, 4, 5. The input signals E1, E2, E3 have the same carrier frequencies of, for example, 21.6 MHz.

So that the input signals E1, E2, E3 may be transmitted via the common high-frequency line 2, a frequency division multiplexing (FDM) method is employed. For this purpose, the input signals E1, E2, E3 are converted into the respective transmission signals U1, U2, U3, which have different transmission frequencies from each other.

In the exemplary embodiment, the first input signal E1 is directly coupled into the high-frequency line 2 as the transmission signal U1 without a frequency conversion so that the first transmission signal U1 is transmitted with a transmission frequency of, for example, 21.6 MHz. The first input signal E1 is filtered solely with the aid of a band-pass filter 6 that only permits frequencies of around, for example, 21.6 MHz to pass through. The outlet of the band-pass filter 6 is therefore coupled to the common high-frequency line 2.

In contrast, the second input signal E2 and the third input signal E3 are each mixed with the aid of a frequency mixer 7, 8 and thus converted into the respective transmission signals U2, U3. The first frequency mixer 7 is an up converter, while the second frequency mixer 8 is a down converter. This provides that the second input signal E2 is mixed upward, while the third input signal E3 is mixed downward. A common oscillator signal LO that has a frequency of, for example, 10 MHz is added to the frequency mixers 7, 8. The oscillator signal LO is divided, for example, with the aid of a power divider between the two frequency mixers 7, 8 so that a first mixer oscillator signal LO1 is added to the first frequency mixer 7, and the second frequency mixer 8 is supplied with a second mixer oscillator signal LO2. The following is applicable with regard to the frequency: LO1=LO2. The mixer oscillator signals LO1, LO2 therefore correspond to the common oscillator signal LO or have the same frequency of, for example, 10 MHz.

As a result, the second transmission signal U2 has a transmission frequency of, for example, 31.6 MHz, while the third transmission signal U3 has a transmission frequency of, for example, 11.6 MHz.

A band-pass filter 9 is also arranged between the second port 4 and the frequency mixer 7. The second input signal E2 is filtered by the band-pass filter 9 before the signal E2 is supplied to the frequency mixer 7. The band-pass filter 9 only permits frequencies of around, for example, 21.6 MHz to pass through so that the noise of the image frequency band of the frequency mixer 7 is suppressed and consequently not mixed into the image frequency band of the frequency mixer 7. An amplifier 10 is also installed downstream of the frequency mixer 7. The second transmission signal U2 is amplified by the amplifier 10 at, for example, 31.6 MHz. An additional band-pass filter 11 is also installed downstream of the amplifier 10, and permits frequencies of around, for example, 31.6 MHz to pass through. The outlet of the band-pass filter 11 is coupled to the common high-frequency line 2.

An additional band-pass filter 12 that permits frequencies of around, for example, 21.6 MHz to pass through is also arranged between the third port 5 and the frequency mixer 8 to filter the third input signal E3. A corresponding amplifier 13 is also installed downstream of the frequency mixer 8, and amplifies the third transmission signal U3 before this transmission signal U3 is filtered with the aid of an additional band-pass filter 14. The band-pass filter 14 has a pass frequency of, for example, 11.6 MHz.

The overall amplification of the second and third transmission signals U2 and U3 may be set at 0 dB so that the signal level of the two paths corresponds to the signal level of the first transmission signal U1. The losses that occur on account of mixing the input signals E2 and E3 are therefore compensated by the two amplifiers 10, 13.

The following transmission signals may therefore be transmitted via the common high-frequency line 2: the transmission signal U1 with the transmission frequency of 21.6 MHz; the transmission signal U2 with the transmission frequency of 31.6 MHz; and the transmission signal U3 with the transmission frequency of 11.6 MHz.

In addition, the common oscillator signal LO, which has a frequency of, for example, 10 MHz, is also transmitted via this common high-frequency line 2. Before the oscillator signal LO is divided into the mixer oscillator signals LO1, LO2, the oscillator signal LO is filtered with the aid of a band-pass filter 15. The band-pass filter 15 permits frequencies of around, for example, 10 MHz to pass through and suppresses the frequencies of the transmission signals U1 to U3.

Figure 2:
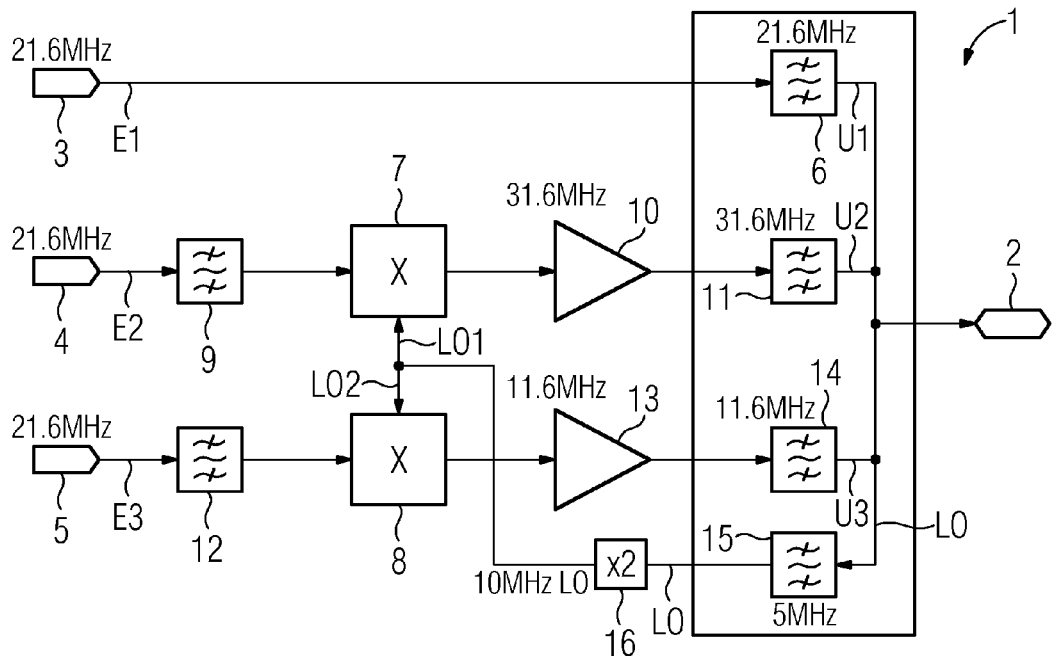
FIG. 2 shows another embodiment of a signal transmission device.

FIG. 2 shows an additional exemplary embodiment of the signal transmission device 1. The only difference between the signal transmission device 1 of FIG. 2 and the signals transmission device 1 of FIG. 1 is that an oscillator signal LO with a frequency of, for example, 5 MHz is transmitted via the common high-frequency line 2, and the band-pass filter 15 has a pass frequency of, for example, 5 MHz accordingly. In order to provide the two mixer oscillator signals LO1, LO2 with a frequency of 10 MHz, a frequency doubler 16, by which the frequency of the oscillator signal LO is doubled, is used. A signal with a frequency of 10 MHz is therefore found at the output of the frequency doubler 16.

FIG. 3 shows a signal transmission device 1 that is different from the device as per FIG. 2 in that an oscillator signal LO that has a frequency of, for example, 40 MHz is transmitted via the high-frequency line 2. Accordingly, the band-pass filter 15 is configured such that the band-pass filter 15 permits frequencies of 40 MHz to pass through. A frequency divider 17 that divides the frequency of the oscillator signal LO by a factor of 4 is used to reduce the frequency of the oscillator signal LO to 10 MHz. This provides that a signal that has a frequency of, for example, 10 MHz is provided at the output of this frequency divider 17.

A further embodiment of the device 1 is shown in FIG. 4. The transmission frequency of the third transmission signal U3 is, for example, 41.6 MHz. To provide such a transmission frequency, an oscillator signal LO with a frequency of, for example, 10 MHz is supplied via the high-frequency line 2 to the device 1, and is then converted into the second mixer oscillator signal LO2 with a frequency of 20 MHz with the aid of a frequency doubler 16. The frequency mixer 8 is an up converter that provides the third transmission signal U3 with a frequency of, for example, 41.6 MHz from the third input signal E3 with a frequency of, for example, 21.6 MHz. Before the frequency doubler 16, the oscillator signal LO is also tapped for the first frequency mixer 7 and supplied to the frequency mixer 7 as a first mixer oscillator signal LO1 with a frequency of, for example, 10 MHz. The first frequency mixer 7 therefore continues to provide a transmission signal U2 with a frequency of, for example, 31.6 MHz. In the exemplary embodiment as per FIG. 4, the band-pass filter 15 is configured such that the pass frequency of the band-pass filter 15 is, for example, 10 MHz.

FIG. 5 shows a device, in which a total of four transmission signals U1 to U4 are transmitted via the common high-frequency line 2. The first three transmission signals U1 to U3 correspond to the first three transmission signals of FIG. 4. An additional port is provided. A fourth input signal E4 is applied to the additional port. The input signal E4 is filtered with the aid of a band-pass filter 19 with a pass frequency of, for example, 21.6 MHz and is supplied to a further frequency mixer 20. The frequency mixer 20 provides the fourth transmission signal U4, which is amplified with the aid of an amplifier 21 and is filtered with the aid of a band-pass filter 22 with a pass frequency of, for example, 51.6 MHz. The fourth transmission signal U4 therefore has a transmission frequency of 51.6 MHz. For this purpose, a third mixer oscillator signal LO3, which has a frequency of, for example, 30 MHz, is supplied to the third frequency mixer 20. The mixer oscillator signal LO3 is generated from the common oscillator signal LO, which has a frequency of, for example, 10 MHz. The band-pass filter 15 therefore has a pass frequency of 10 MHz.

In order to convert the oscillator signal LO into the third mixer oscillator signal LO3, a frequency multiplier 23 that multiplies the frequency of the oscillator signal LO by a factor of 3 is used. The frequency mixer 20, similar to the other mixers 7, 8, is an up converter.

Any number of mixer oscillator signals LO1 to LOn may therefore be supplied from the same oscillator signal LO so that any or a greater number of transmission signals may also be transmitted via the common high-frequency line 2. Embodiments shown in FIGS. 1 to 5 may also be combined with each other. If a signal transmission device 1 such as that shown in FIGS. 1 to 5 is used in a magnetic resonance tomography system, then the cabling is reduced considerably in comparison to the prior art. The feature that one of the input signals (e.g., the signal E1) is directly transmitted unmixed as a transmission signal U1 via the high-frequency line 2 contributes to this.

The common high-frequency line 2 is coupled on the other side (not shown), for example, with an electronic evaluation device of a magnetic resonance tomography system. There, the transmission signals U1 to U4 may be individually obtained again by, for example, using corresponding band-pass filters. The signals may be down-mixed in baseband or directly converted into digital signals with the aid of an analog-digital converter and further processed as such.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for simultaneous transmission of at least two high-frequency transmission signals via a common high-frequency line, the method comprising:
   inputting at least two input signals at respective inlet ports, wherein the at least two input signals are signals of a same carrier frequency;
   generating, from the at least two input signals, respective transmission signals with different transmission frequencies from each other and from a carrier frequency, the generating of the respective transmission signals comprising mixing the at least two input signals using one frequency mixer each, wherein the frequency mixers are supplied with respective mixer oscillator signals;
   transmitting the generated transmission signals via the common high-frequency line, wherein the mixer oscillator signals are provided from a same oscillator signal; and
   generating, by a computing device, an image based on the transmitted generated transmission signals.

2. The method as claimed in claim 1, wherein inputting at least two input signals comprises inputting at least three input signals of the same carrier frequency, and wherein the method further comprises transmitting one input signal of the at least three input signals as a transmission signal unmixed with the carrier frequency via the common high-frequency line.

3. The method as claimed in claim 1, further comprising transmitting the oscillator signal via the common high-frequency line to the frequency mixers.

4. The method as claimed in claim 1, wherein at least two of the mixer oscillator signals provided from the same oscillator signal are signals of the same frequency, and
   wherein a first of the frequency mixers is an up converter and a second of the frequency mixers is a down converter.

5. The method as claimed in claim 1, wherein at least one of the mixer oscillator signals is generated from the oscillator signal by a frequency divider.

6. The method as claimed in claim 1, wherein at least one of the mixer oscillator signals is generated from the oscillator signal by a frequency multiplier.

7. The method as claimed in claim 1, wherein for at least one of the frequency mixers the oscillator signal is used directly as one or the mixer oscillator signals.

8. The method as claimed in claim 1, wherein the at least two input signals are provided as receive signals of a magnetic resonance tomography system.

9. A signal transmission device for simultaneous transmission of at least two high-frequency transmission signals via a common high-frequency line, the signal transmission device comprising:
   at least two inlet ports operable to provide at least two respective input signals, wherein the at least two input signals are signals of a same carrier frequency;
   at least two frequency mixers operable to provide, from the at least two input signals, respective transmission signals with different transmission frequencies from each other and from a carrier frequency by mixing the at least two input signals, wherein the at least two frequency mixers are supplied with respective mixer oscillator signals; and
   the common high-frequency line operable to transmit the transmission signals, wherein the mixer oscillator signals are provided from a same oscillator signal.

10. The signal transmission device as claimed in claim 9, wherein the at least two inlet ports comprise at least three input ports operable to provide at least three respective input signals of the same carrier frequency, and
   wherein the common high-frequency line is operable to transmit one input signal of the at least three input signals as a transmission signal unmixed with the carrier frequency.

11. The signal transmission device as claimed in claim 9, wherein the common high-frequency line is operable to transmit the oscillator signal to the frequency mixers.

12. The signal transmission device as claimed in claim 9, wherein at least two of the mixer oscillator signals provided from the same oscillator signal are signals of the same frequency, and
   wherein a first of the frequency mixers is an up converter and a second of the frequency mixers is a down converter.

13. The signal transmission device as claimed in claim 9, further comprising a frequency divider operable to generate at least one of the mixer oscillator signals from the oscillator signal.

14. The signal transmission device as claimed in claim 9, further comprising a frequency multiplier operable to generate at least one of the mixer oscillator signals from the oscillator signal.

15. A magnetic resonance tomography system comprising:
   a signal transmission device for simultaneous transmission of at least two high-frequency transmission signals via a common high-frequency line, the signal transmission device comprising:

at least two inlet ports operable to provide at least two respective input signal, wherein the at least two input signals are signals of a same carrier frequency;

at least two frequency mixers operable to provide, from the at least two input signals, respective transmission signals with different transmission frequencies from each other and from a carrier frequency by mixing the at least two input signals, wherein the at least two frequency mixers are supplied with respective mixer oscillator signals; and the common high-frequency line operable to transmit the transmission signals, wherein the mixer oscillator signals are provided from a same oscillator signal.

16. The magnetic resonance tomography system as claimed in claim 15, wherein the at least two inlet ports comprise at least three input ports operable to provide at least three respective input signals of the same carrier frequency, and wherein the common high-frequency line is operable to transmit one input signal of the at least three input signals as a transmission signal unmixed with the carrier frequency.

17. The magnetic resonance tomography system as claimed in claim 15, wherein the common high-frequency line is operable to transmit the oscillator signal to the frequency mixers.

18. The magnetic resonance tomography system as claimed in claim 15, wherein at least two of the mixer oscillator signals provided from the same oscillator signal are signals of the same frequency, and wherein a first of the frequency mixers is an up converter and a second of the frequency mixers is a down converter.

19. The magnetic resonance tomography system as claimed in claim 15, wherein the signal transmission device further comprises a frequency divider operable to generate at least one of the mixer oscillator signals from the oscillator signal.

20. The magnetic resonance tomography system as claimed in claim 15, wherein the signal transmission device further comprises a frequency multiplier operable to generate at least one of the mixer oscillator signals from the oscillator signal.

\* \* \* \* \*